United States Patent
La Rosa

(10) Patent No.: US 8,363,499 B2
(45) Date of Patent: Jan. 29, 2013

(54) SELF-TIMED LOW POWER SENSE AMPLIFIER

(75) Inventor: Francesco La Rosa, Rousset (FR)

(73) Assignee: STMicroelectrics (Rousset) SAS (FR)

( * ) Notice: Subject to any disclaimer, the term of this patent is extended or adjusted under 35 U.S.C. 154(b) by 265 days.

(21) Appl. No.: 12/844,472

(22) Filed: Jul. 27, 2010

(65) Prior Publication Data

US 2011/0026346 A1     Feb. 3, 2011

(30) Foreign Application Priority Data

Jul. 31, 2009    (FR) ...................... 09 03804

(51) Int. Cl.
*G11C 7/06* (2006.01)
(52) U.S. Cl. ...................... 365/207; 365/205
(58) Field of Classification Search .................. 365/205, 365/207

See application file for complete search history.

(56) References Cited

U.S. PATENT DOCUMENTS

| | | | |
|---|---|---|---|
| 4,973,864 A | 11/1990 | Nogami | |
| 5,764,572 A | 6/1998 | Hammick | |
| 6,307,798 B1 * | 10/2001 | Ahmed et al. | 365/207 |
| 6,323,847 B1 * | 11/2001 | Kaneko et al. | 345/204 |
| 2002/0009009 A1 * | 1/2002 | Ahmed et al. | 365/207 |

FOREIGN PATENT DOCUMENTS

WO    9610866 A1    4/1996

* cited by examiner

*Primary Examiner* — Michael Tran
(74) *Attorney, Agent, or Firm* — Seed IP Law Group PLLC

(57) ABSTRACT

A sense amplifier is disclosed comprising a first sense input, a second sense input, a latch, a first p-channel control transistor arranged to electrically power a first section of the latch and having a gate terminal linked to the first sense input, and a second p-channel control transistor arranged to electrically power a second section of the latch and having a gate terminal linked to the second sense input. Application may be in particular to low power embedded memories.

25 Claims, 5 Drawing Sheets

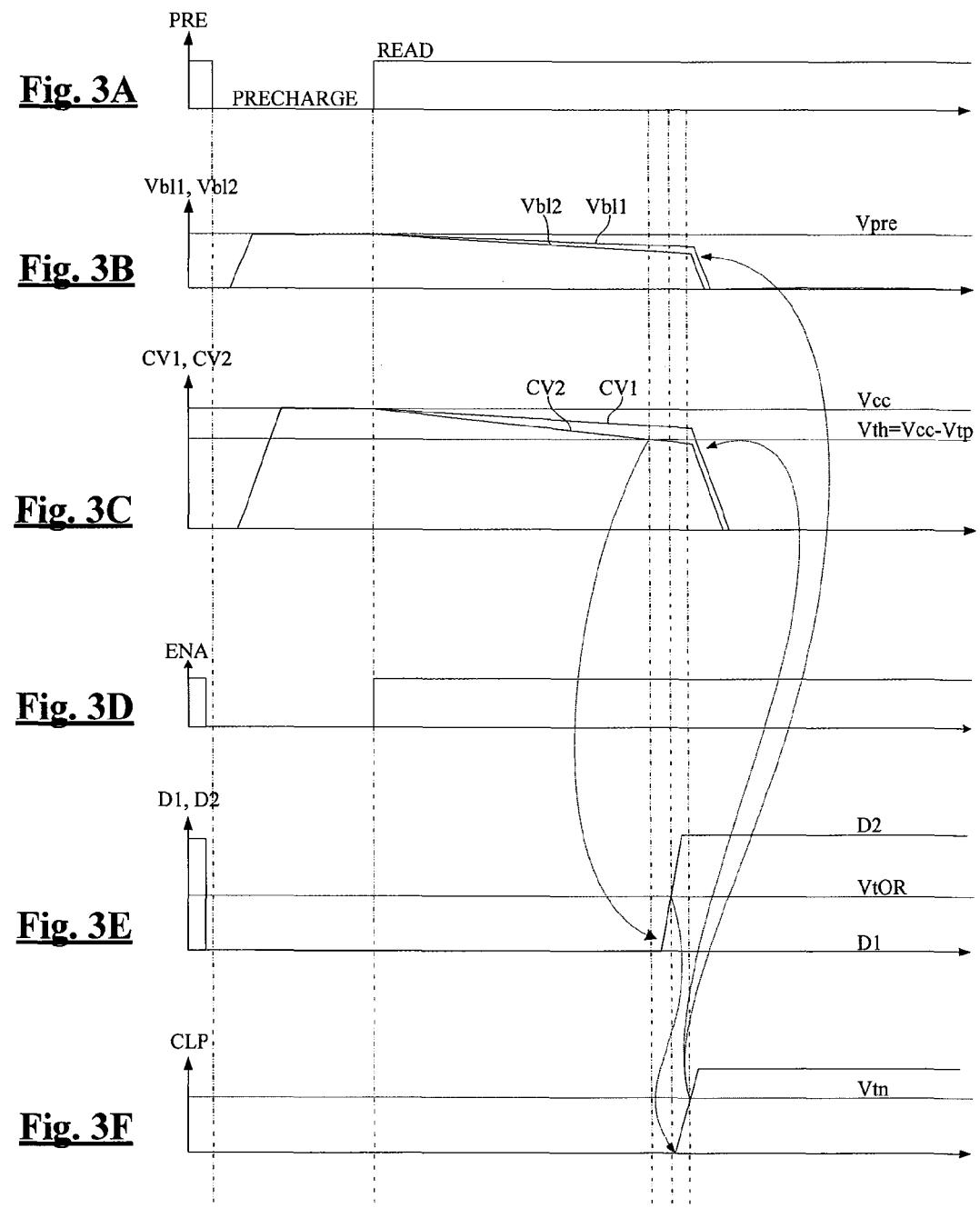

SELF-TIMED LOW POWER SENSE AMPLIFIER

BACKGROUND

1. Technical Field

The present disclosure relates to nonvolatile memories and more particularly to a sense amplifier for reading nonvolatile memory cells.

2. Description of the Related Art

Sense amplifiers are conventionally used to sense a conductivity state of non-volatile memory cells, which can generally be a high conductivity state or a low conductivity state, and to output a data signal that is a function of the state of the memory cell. For example, electrically erasable and programmable memory cells can be in a programmed state or in an erased state, which correspond to two different conductivities.

Sense amplifiers may be single-ended or differential. Single-ended sense amplifiers have an internal current source or voltage source to sense, via a single sense input, the state of a memory cell. Differential sense amplifiers have two sense inputs. FIG. 1 shows an example of a conventional differential sense amplifier SA1, of the type disclosed in U.S. Pat. No. 5,764,572. Sense amplifier SA1 has a first sense input SI1 and a second sense input SI2. The first sense input SI1 is linked to a memory cell MC through a bitline BL1. The second sense input SI2 is connected to a reference line BL2 linked to a current source CS or to any other reference element such as a reference resistor.

Sense amplifier SA1 comprises a latch LT1 comprising two cross-coupled inverting gates IV1, IV2, each comprising one p-channel transistor T1, T11 and one re-channel transistor T2, T12, respectively. The output of gate IV1 and the input of gate IV2 are connected to a first input/output node IO1, and the output of gate IV2 and the input of gate IV1 are connected to a second input/output node IO2. Node IO1 supplies data signal D and node IO2 supplies inverted data signal /D.

Node IO1 is also linked to the first sense input SI1 through p-channel and re-channel isolation transistors T3, T4 arranged in parallel, and an n-channel cascode transistor T6. Node IO2 is also linked to the second sense input SI2 through p-channel and n-channel isolation transistors T13, T14 arranged in parallel, and an n-channel cascode transistor T16. Isolation transistors T3, T13 are controlled by a signal IS, and isolation transistors T4, T14 are controlled by an inverted signal /IS. The cascode transistors T6, T16 are controlled by a voltage Vcsc.

Sense amplifier SA1 also comprises p-channel precharge transistors T5, T15 controlled by a precharge signal PRE, whose drain terminals (D) are respectively connected to the drain terminal (D) of transistor T6 and the drain terminal (D) of the transistor T16.

The reading of memory cell MC comprises a precharge phase and a read phase. During the precharge phase, the first and second sense inputs are brought to a precharge voltage Vpre by means of transistors T5, T15 and through the cascode transistors T6, T16. A voltage Vcc is applied on the source terminals (S) of transistors T1, T11 of the latch LT1 while a signal ACT is applied on the source terminals (S) of transistors T2, T12. During the precharge phase, signal ACT is set to voltage Vcc, thereby maintaining transistors T2, T12 in the OFF state.

Once voltage Vpre has been reached on bitline BL1 and on reference line BL2, the precharge signal PRE is pulled high and the reading of the memory cell MC starts. The voltages present on the first and second sense inputs SI1, SI2 begin to decrease at different rates, creating a voltage difference that depends on whether the memory cell is in the high or low conductivity state. If the memory cell is in the high conductivity state, the voltage present on the bitline BL1 drops more quickly than that on the reference line BL2. If the memory cell is in the low conductivity state, the voltage present on the bitline BL1 drops more slowly than that on the reference line BL2. The voltage difference between the bitline and the reference line is amplified by the cascode transistors T6, T16 and an amplified voltage difference appears between nodes IO1, IO2 of the latch.

Transistors T3, T4, T13, T14 are then deactivated, thereby disconnecting nodes IO1, IO2 from the sense inputs SI1, SI2, and the latch is fully activated by setting signal ACT to zero. The amplified voltage difference between nodes IO1, IO2 forces the latch into one of its two possible stable states, and sense amplifier SA1 outputs a data signal D=0 or D=1 corresponding to the conductivity state of the memory cell.

Such a conventional sense amplifier may have some drawbacks according to the conditions in which it is used or implemented. In particular, the n-channel isolation transistors T4, T14 must be quite large and, in low voltage integrated circuits, must be driven by a boosted voltage /IS supplied by a charge pump since they are arranged in the precharge path. Therefore, a significant amount of power may be consumed when switching them with a charge pump due to charge pump efficiency problems.

In addition, when such a sense amplifier SA1 is implemented in integrated circuits using low power supply, it may happen that the latch LT1 remains in a "metastable" state (i.e., neither 1 nor 0), thereby outputting a corrupted data signal. In particular, such a problem may arise in integrated circuits powered by a voltage Vcc of less than 1.8 V, for example those manufactured according to the 180 nanometer CMOS process.

Therefore, it may be desired to provide a low power sense amplifier optimized for low voltage memory chips.

BRIEF SUMMARY

Embodiments in this disclosure relate to a sense amplifier comprising a first sense input, a second sense input, a latch comprising a first section supplying a first data signal and a second section coupled to the first section and supplying a second data signal, a first p-channel control transistor arranged to electrically power the first section and having a gate terminal linked to the first sense input, and a second p-channel control transistor arranged to electrically power the second section and having a gate terminal linked to the second sense input.

According to one embodiment, the first section of the latch comprises at least a first inverting gate, the second section of the latch comprises at least a second inverting logic gate, and the first and second inverting gates are cross-coupled.

According to one embodiment, the sense amplifier comprises clamp means arranged to bring the first and second sense inputs to a voltage sufficiently low to bring the first and second control transistors into the conducting state, and means for activating the clamp means when at least one of the first and second data signals increases and reaches a threshold voltage.

According to one embodiment, the means for activating the clamp means comprises an OR gate supplying a clamp signal when one of the first and second outputs of the latch reaches a threshold voltage of the OR gate.

According to one embodiment, the sense amplifier comprises cascode transistors arranged between the first sense input and the gate terminal of the first control transistor and between the second sense input and the gate terminal of the second control transistor.

According to one embodiment, the sense amplifier comprises precharge means to bring the gate terminal of the first control transistor and the gate terminal of the second control transistor to a first voltage, and to bring, via the cascode transistors, the first sense input and the second sense input to a second voltage.

According to one embodiment, one conducting terminal of each of the first and second control transistors receives an enable signal as a power voltage source.

One embodiment also relates to a memory device comprising memory cells connected to bitlines and at least one sense amplifier according to one embodiment, having one sense input linked to at least one bitline.

According to one embodiment, the memory device comprises first and second memory arrays, and the first sense input is linked to bitlines of the first memory array and the second sense input is linked to bitlines of the second memory array.

One embodiment also relates to an integrated circuit on a semiconductor chip, comprising a memory device according to one embodiment.

One embodiment also relates to a handheld device, comprising an integrated circuit according to one embodiment.

One embodiment also relates to a method for sensing a memory cell, comprising supplying a first data signal by means of a first section of a latch; supplying a second data signal by means of a second section of the latch, coupled to the first section; electrically powering the first section through a first p-channel control transistor; electrically powering the second section through a second p-channel control transistor; linking the first control transistor to a bitline to which the memory cell is connected; and linking the second control transistor to a reference line.

According to one embodiment, the method further comprises bringing the bitline and the reference line to a voltage sufficiently low to bring the first and second control transistors into the conducting state, when at least one of the first and second data signals increases and reaches a threshold voltage.

According to one embodiment, the method further comprises amplifying a voltage difference present between the first sense input and the second sense input and applying an amplified voltage difference between the first and second gate terminal of the control transistors.

According to one embodiment, the method comprises a precharge step comprising bringing the gate terminal of the first control transistor and the gate terminal of the second control transistor to a first voltage, and bringing the first sense input and the second sense input to a second voltage.

BRIEF DESCRIPTION OF THE SEVERAL VIEWS OF THE DRAWINGS

Embodiments of a sense amplifier and applications thereof will be described in the following description, in relation with but not limited to the following figures, in which:

FIGS. 3A to 3F are timing diagrams of electrical signals in the sense amplifier of FIG. 2 during the reading of a memory cell in a low conductivity state.

DETAILED DESCRIPTION

Figure 2:
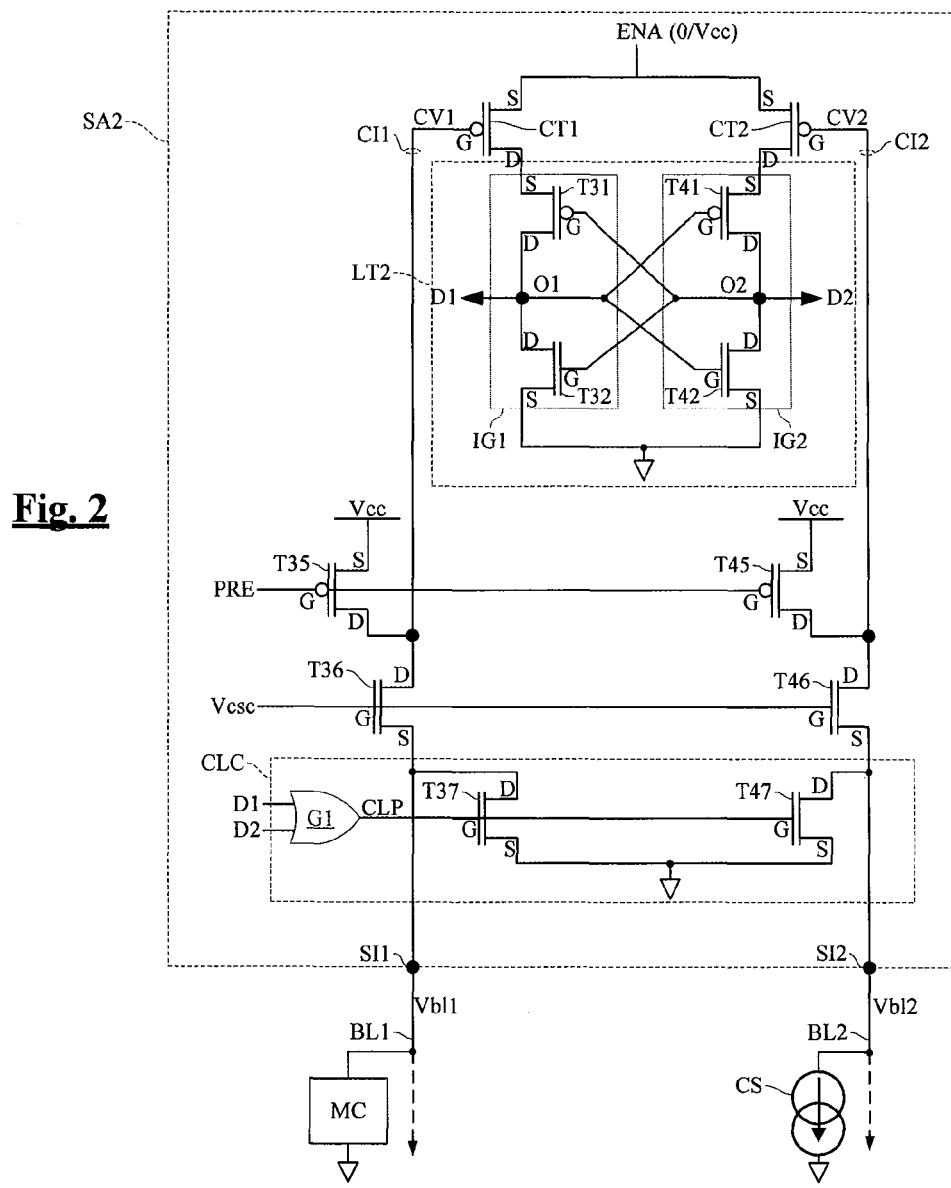
FIG. 2 shows a differential sense amplifier according to one embodiment.

A sense amplifier SA2 according to one embodiment is shown in FIG. 2.

Sense amplifier SA2 has a first sense input SI1 and a second sense input SI2. The first sense input SI1 is linked to a memory cell MC through a bitline BL1. The second sense input SI2 is connected to a reference line BL2 linked to a current source CS or any other reference element such as a reference resistor. Alternatively, the second sense input SI2 may be linked to memory cell MC through a bitline, and the first sense input SI1 may be linked to a reference line linked to a current source or another reference element.

Sense amplifier SA2 comprises a latch LT2 comprising a first section IG1, a second section IG2 coupled to the first section IG1, a first output node O1 and a second output node O2. The first section IG1 has an output connected to the output node O1 and supplies a logic data signal D1. The second section IG2 has an output connected to the output node O2 and supplies a logic data signal D2. Each section IG1, IG2 is powered by an enable signal ENA which is brought to a voltage Vcc (ENA=1) when the latch is to be activated and is brought to ground (ENA=0) when the latch is to be deactivated. Means to force to 0 data signals D1, D2 when the enable signal ENA is equal to 0 may also be provided, for example n-channel transistors connected between the outputs O1, O2 (not shown) and the ground and controlled by a signal /ENA which is equal to Vcc when ENA is equal to 0, and vice-versa.

According to one embodiment, the power supply signal ENA, that is to say the power supply voltage Vcc when ENA=1, is applied to the first section IG1 through a first p-channel control transistor CT1, and is applied to the second section IG2 through a second p-channel control transistor CT2. The gate terminal (G) of transistor CT1 forms a first control input CI1 of the latch LT2 and is linked to the first sense input SI1 of sense amplifier SA2. The gate terminal (G) of transistor CT2 forms a second control input CI2 of the latch and is linked to the second sense input SI2 of sense amplifier SA2.

In the embodiment shown in FIG. 2, the first control input CI1 of the latch is linked to the first sense input SI1 through a cascode n-channel transistor T36 and the second control input CI2 of the latch is linked to the second sense input SI2 through a cascode n-channel transistor T46. Cascode transistors T36, T46 are controlled by a voltage Vcsc applied on their gate terminals (G).

Still in the embodiment shown in FIG. 2, the first and second sections IG1, IG2 are cross-coupled inverting gates, the input of gate IG1 being connected to the output of gate IG2 and vice-versa. Inverting gate IG1 comprises for example p-channel transistor T31 and n-channel transistor T32 having their drain terminals (D) connected to the output node O1 and their gate terminals (G) connected to the output node O2. The source terminal (S) of transistor T32 is connected to ground and the source terminal (S) of transistor T31 is connected to the drain terminal (D) of control transistor CT1, whose source terminal (S) receives the power and enable signal ENA. Likewise, inverting gate IG2 comprises for example a p-channel transistor T41 and an n-channel transistor T42 having their drain terminals (D) connected to the output node O2 and their gate terminals (G) connected to the output node O1. The source terminal (S) of transistor T42 is connected to ground and the source terminal (S) of transistor T41 is connected to the drain terminal (D) of control transistor CT2, whose source terminal (S) receives the power and enable signal ENA.

Sense amplifier SA2 also comprises p-channel precharge transistors T35, T45. Each precharge transistor T35, T45 has its drain terminal (D) connected to one control input of the latch, respectively CI1, CI2, receives voltage Vcc on its source terminal (S), and a precharge signal PRE on its gate terminal (G).

Sense amplifier SA2 also comprises a clamp circuit CLC. The clamp circuit CLC comprises two n-channel transistors T37, T47. Each transistor T37, T47 has its drain terminal (D) connected to one sense input SI1, SI2 respectively, its source terminal (S) connected to ground, and receives a clamp signal CLP on its gate terminal (G).

In one embodiment, the clamp signal CLP is automatically activated when one of the first and second data signals D1, D2 increases and reaches a threshold voltage. As shown in FIG. 2, the clamp signal CLP is for example supplied by an OR gate G1 that receives the first and second data signals D1, D2 in input.

The functioning of sense amplifier SA2 will now be described. FIGS. 3A to 3F show different signals and voltages in sense amplifier SA2 during precharge and read phases, when the memory cell MC is in a low conductivity state (for example a programmed state). FIGS. 4A to 4F show the same signals and voltages in sense amplifier SA2 during the same precharge and read phases, when the memory cell MC is in a high conductivity state (for example an erased state).

Figure 4A:
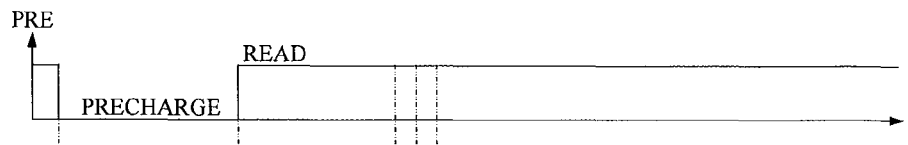
FIGS. 4A to 4F are timing diagrams of electrical signals in the sense amplifier of FIG. 2 during the reading of a memory cell in a high conductivity state.
Figure 4B:
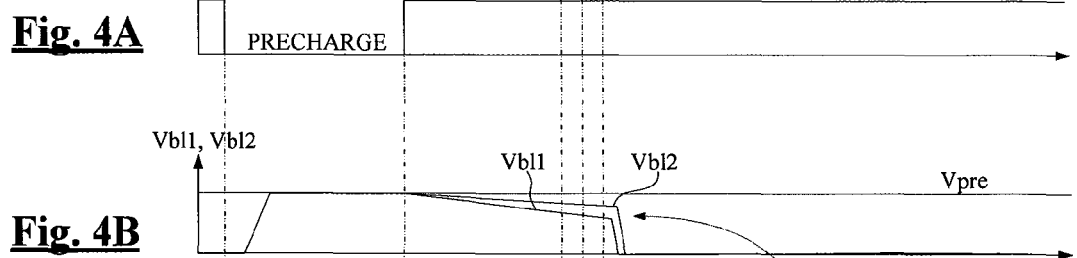
Figure 4C:
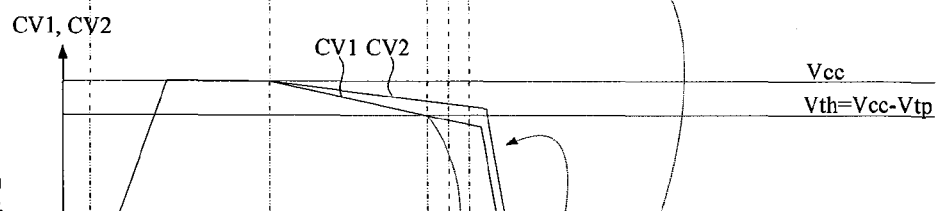
Figure 4D:
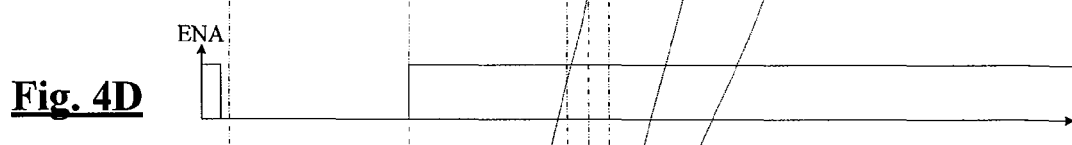
Figure 4E:
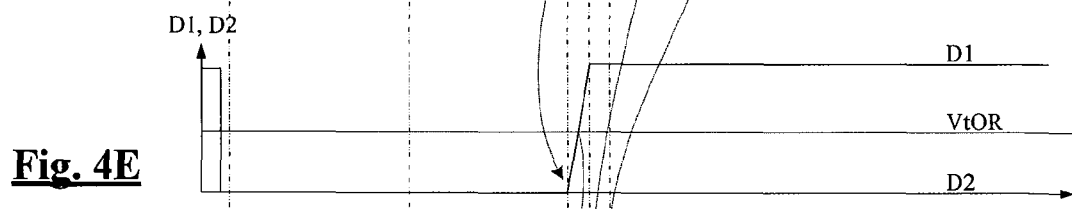
Figure 4F:
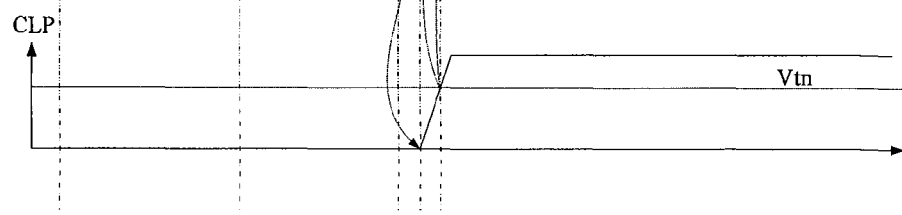

More particularly, FIGS. 3A, 4A show the shape of the precharge signal PRE; FIGS. 3B, 4B show the shapes of bitline voltages Vbl1 and Vbl2 that are respectively present on the sense inputs SI1 and SI2; FIGS. 3C, 4C show the shape of control voltages CV1 and CV2 respectively present on the control inputs CI1 and CI2; FIGS. 3D, 4D show the shape of the enable signal ENA; FIGS. 3E, 4E show the shape of data signals D1 and D2 supplied by the output nodes O1 and O2; and FIGS. 3F, 4F show the shape of the clamp signal CLP.

As previously indicated, the second sense input SI2 is linked to the current source CS through the reference line BL2. It is assumed that the current source CS draws a constant current whose value is set between the current passing through a memory cell in the high conductivity state and that passing through a memory cell in the low conductivity state.

The precharge phase starts when signal PRE is set to zero (FIGS. 3A, 4A) so that p-channel transistors T35, T45 become conducting. The cascode voltage Vcsc is applied to the gate of transistors T36, T46. This causes the bitline voltages Vbl1 and Vbl2 to begin to increase (FIGS. 3B, 4B) until they reach a precharge voltage Vpre approximately equal to Vcsc−Vgs, Vgs being the gate-source voltage of transistors T36, T46. Control voltages CV1, CV2 on the control inputs CI1, CI2 also increase and reach a voltage equal to Vcc (FIGS. 3C, 4C).

It is assumed that the enable signal ENA has previously been set to zero (FIGS. 3D, 4D) so that the latch LT2 is currently deactivated and its output nodes O1, O2 are in the HZ state (high impedance). Therefore, in FIGS. 3E, 4E, data signals D1, D2 are shown as equal to zero during the precharge phase.

Sense amplifier SA2 enters the read phase when the precharge signal PRE is switched back to 1 (FIG. 3A) in order to disable transistors T35, T45. At approximately the same time, the enable signal ENA is set to 1 (Vcc). As they are no longer being charged, the bitline BL1, and the reference line BL2 begin to discharge (FIGS. 3B, 4C). The bitline voltages Vbl1, Vbl2 begin to decrease from Vcsc-Vgs (FIGS. 3B, 4B) and control voltages CV1, CV2 begin to decrease from Vcc (FIGS. 3C, 4C).

If the memory cell MC is in the low conductivity state, the current passing through the memory cell is less than the reference current drawn by the current source. Therefore, the reference line BL2 discharges at a faster rate than bitline BL1 and, as shown in FIG. 3B, voltage Vbl2 decreases faster than voltage Vbl1. The voltage difference between Vbl1, Vbl2 is amplified by the cascode transistors T36, T46 and a larger voltage difference appears between control voltages CV1, CV2. Voltage CV2 decreases faster than voltage CV1, as shown in FIG. 3C.

If the memory cell MC is in the high conductivity state, the current passing through the memory cell is greater than the reference current drawn by the current source. Therefore, bitline BL1 discharges at a faster rate than the reference line BL2 and, as shown in FIG. 4B, voltage Vbl1 decreases faster than voltage Vbl2. The voltage difference between Vbl1, Vbl2 is amplified by the cascode transistors T36, T46 and voltage CV1 decreases faster than voltage CV2, as shown in FIG. 4C.

In both cases, the voltage CV1 or CV2 that decreases the fastest reaches a threshold voltage Vth such that the corresponding transistor CT1 or CT2 becomes conducting. Transistors CT1 and CT2 being of the p-type and the latch being powered by voltage Vcc (supplied as the enable signal ENA), such threshold voltage Vth is here equal to Vcc−Vtp, Vtp being the threshold voltage of p-channel transistors CT1, CT2.

In FIG. 3C, voltage CV2 is the first to reach the threshold voltage Vth, so that control transistor CT2 is the first to become conducting. Therefore, transistor CT2 passes voltage Vcc to the inverting gate IG2, and data signal D2 on the output node O2 begins to rise as shown in FIG. 3E.

In FIG. 4C, control voltage CV1 is the first to reach the threshold voltage Vth, so that control transistor CT1 is the first to become conducting. Therefore, transistor CT1 passes voltage Vcc to the inverting gate IG1, and data signal D1 on the output node O1 begins to rise as shown in FIG. 4E.

Then, signal D2 or signal D1 reaches a threshold value VtOR of the OR gate G1 and the clamp signal CLP goes from 0 to 1 (Vcc) (FIG. 3F or 4F). When the clamp signal reaches a threshold voltage Vtn of the n-channel transistors T37, T47, the latter become conducting and connect the first and second sense inputs SI1, SI2 to ground. Bitline voltages Vbl1, Vbl2, as well as the control voltages CV1, CV2 are pulled to ground (FIGS. 3B and 3C, 4B and 4C) which brings both p-channel control transistors CT1, CT2 into the fully conducting state. The latch becomes fully operational and latches the provisional values of data signals D1 and D2, that is to say D1=0 and D2=1 in FIG. 3E or D1=1 and D2=0 in FIG. 4E, which become the final latched data values for the current read phase.

Figure 1:
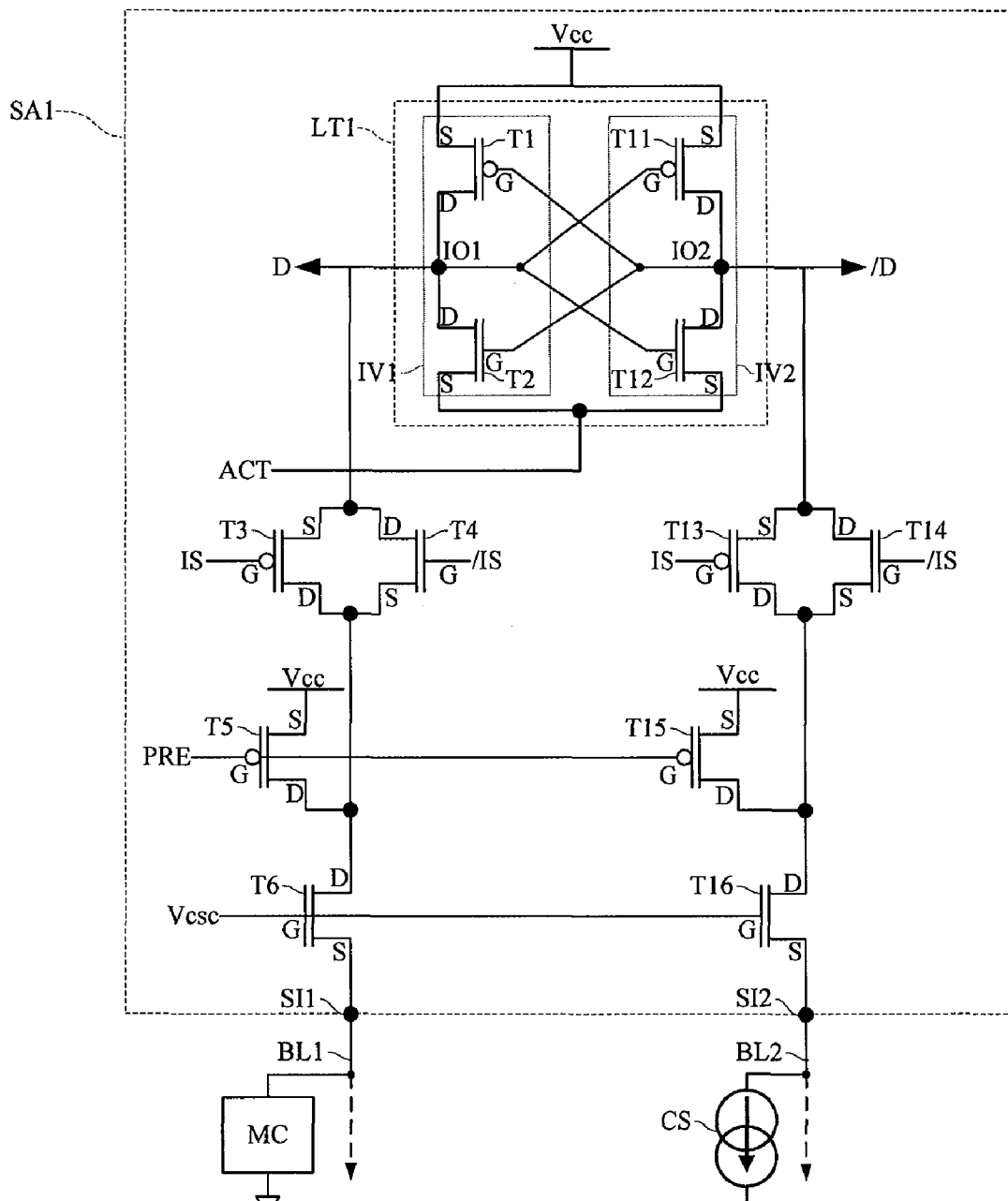
FIG. 1 shows a conventional differential sense amplifier.

It will be noted that the use of the gate terminal of control transistors CT1, CT2 as "sense means" in combination with powering the latch through such transistors removes the need for the isolation transistors described above in connection with FIG. 1, which are necessary in the prior art to disconnect the inputs of the latch from the sense inputs during the read phase, in order to sample the voltage difference between the sense input without having the output nodes of the latch interacting with the sensed bitline.

In other respects, the use of the provisional values of data signals D1, D2 to activate the clamp circuit CLP, which in return causes the latch to become fully operational and the provisional values of D1, D2 to be latched, makes sense amplifier SA2 "self-timed". However, embodiments may be provided where the clamp signal is activated by non self-timed means, for example a timer that is triggered on when the read phase starts.

In addition, it will be noted that embodiments of a sense amplifier according to the present disclosure may comprise different other types of precharge means, cascode means (i.e., voltage limiting means) and clamp means other than those that have been described above. In addition, the first and second sections IG1, IG2 of the latch are susceptible of different other embodiments and may comprise, for example, other logic gates such as NAND gates, NOR gates, transistors in series or parallel, etc., as deemed desirable by the skilled person wishing to implement embodiments according to this disclosure.

Figure 5:
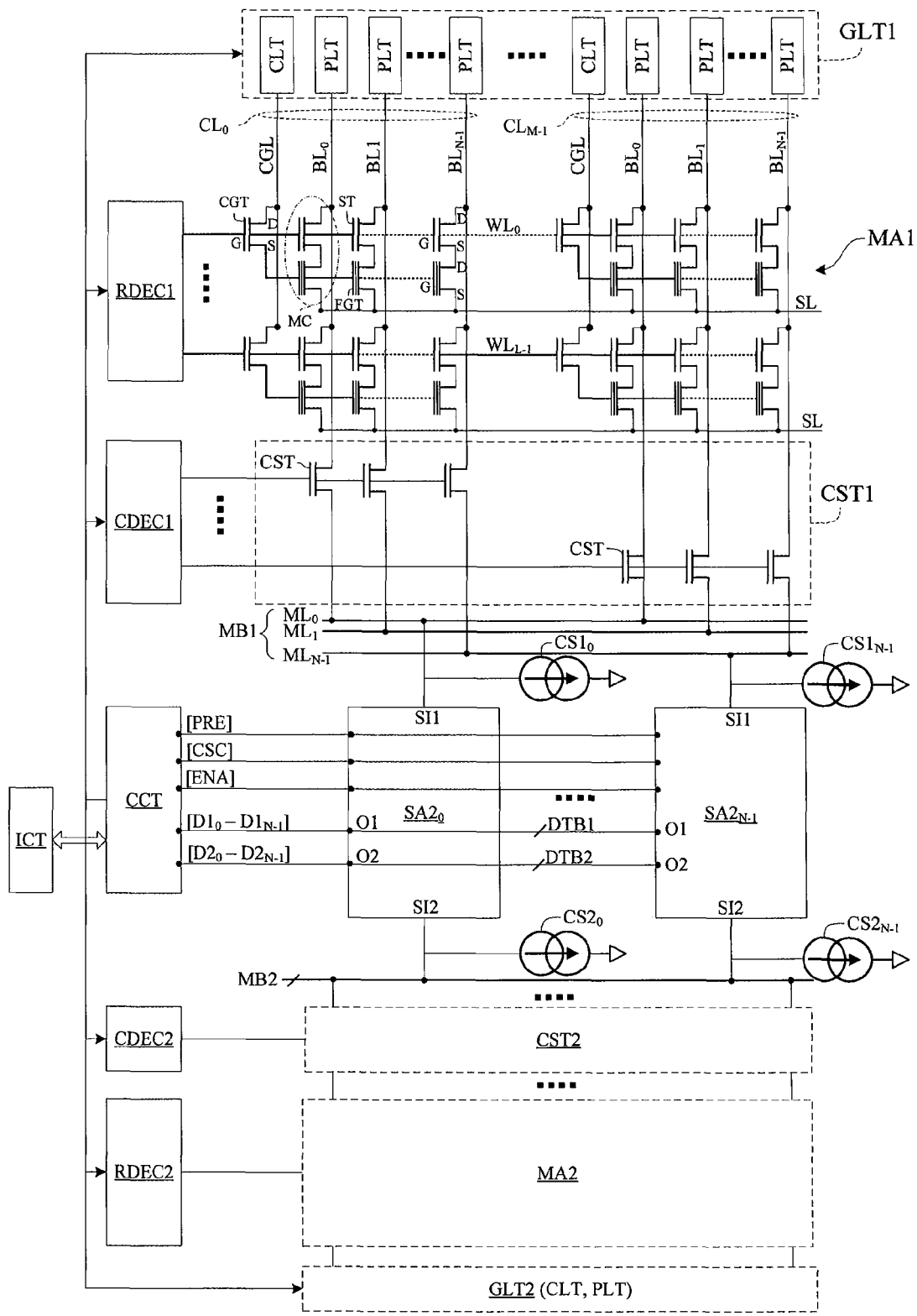
FIG. 5 shows a memory device comprising a sense amplifier according to one embodiment.

FIG. 5 shows an example application in which a series of sense amplifiers according to one embodiment are incorporated into an electrically erasable and programmable nonvolatile memory device MEM1. The memory device MEM1 comprises two memory arrays MA1, MA2. Memory array MA2 has the same structure as memory array MA1 and is shown as a block. Each memory array MA1, MA2 comprises L wordlines WL ($WL_0$-$WL_{L-1}$) and M columns CL ($CL_0$ to $CL_{M-1}$). Each column CL comprises N bitlines BL ($BL_0$-$BL_{N-1}$) and one control gate line CGL. Each memory array MA1, MA2 comprises L*M*N memory cells MC. In this example, memory arrays MA1, MA2 are word erasable and word programmable, a word comprising memory cells of the same column connected to the same wordline.

Each memory cell MC within a word comprises a selection transistor ST and a floating gate transistor FGT. The selection transistor ST has its drain terminal (D) connected to a bitline BL, its source terminal (S) connected to the drain terminal (D) of the floating gate transistor, and its gate terminal (G) connected to a wordline WL. The floating gate transistor FGT has its source terminal (S) connected to a source line SL and its gate terminal (G) connected to the source terminal (S) of a control gate transistor CGT. The control gate transistor CGT has its gate terminal (G) connected to the considered wordline and it drain terminal (D) connected to the control gate line CGL of the considered column.

The memory device MEM1 also comprises first and second row decoders RDEC1, RDEC2; first and second column decoders CDEC1, CDEC2; first and second groups GLT1, GLT2 of column latches CLT and program latches PLT; first and second groups CST1, CST2 of column selection transistors CST; first and second multiplexing buses MB1, MB2; a central row of N sense amplifiers SA2 ($SA2_0$-$SA2_{N-1}$) according to one embodiment; and a central control circuit CCT such as a microprocessor, a micro-programmed sequencer, or a state machine receiving commands and data from the outside and supplying responses and data to the outside through an interface communication circuit ICT.

The row decoder RDEC1 supplies row selection signals to the wordlines WL ($WL_0$-$WL_{L-1}$) of memory array MA1 and the row decoder RDEC2 supplies row selection signals to the wordlines of memory array MA2. The column decoder CDEC1 supplies column selection signals to the column selection transistors CST of group CST1 and the column decoder CDEC2 supplies column selection signals to the column selection transistors of group CST2.

Bitlines of memory array MA1 belonging to different columns and having the same rank or weight (i.e., storing bits of same rank of the different words) are linked to the sense input SI1 of the same sense amplifier SA2 through the column selection transistors CST of group CST1 and the multiplexing bus MB1. Likewise, bitlines of memory array MA2 belonging to different columns and having the same rank or weight are linked to the sense input SI2 of the same sense amplifier SA2 through the column selection transistors of group CST2 and the multiplexing bus MB2. For example, bitlines $BL_0$ of columns $CL_0$ to $CL_{M-1}$ are linked to sense amplifier $SA2_0$ through transistors CST and a line $ML_0$ of the multiplexing bus MB1. Bitlines $BL_{N-1}$ of columns $CL_0$ to $CL_{M-1}$ are linked to sense amplifier $SA2_{N-1}$ through transistors CST and a line $ML_{N-1}$ of the multiplexing bus MB1.

Control circuit CCT supplies the above-described precharge signal PRE, cascode signal CSC, and enable signal ENA to sense amplifiers $SA2_0$-$SA2_{N-1}$. Outputs O1 of sense amplifiers $SA2_0$-$SA2_{N-1}$ are connected to different lines of a data bus DTB1 and outputs O2 are connected to different lines of a data bus DTB2.

Finally, each sense input SI1 of each sense amplifier $SA2_0$ to $SA2_{N-1}$ is linked to a current source $CS1_0$ to $CS1_{N-1}$ through a reference line and each sense input SI2 of each sense amplifier $SA2_0$ to $SA2_{N-1}$ is linked to a current source $CS2_0$ to $CS2_{N-1}$ through a reference line. Each current source CS1, CS2 is arranged between the sense input and the multiplexing lines, as shown in FIG. 5, but may also be connected to one bitline to which the considered sense input is linked though the multiplexing bus.

Steps of programming and erasing memory cells will not be described in detail and are performed by control circuit CCT, which controls the decoders RDEC1, RDEC2, CDEC1, CDEC2 and provides them with row and column addresses received through interface ICT, as well as with control signals and a program or erase voltage Vpp. Control circuit CCT also provides the program latches with data received through the interface ICT, and the column latches are selected and activated by the column selection signals supplied by the column decoder CDEC1. Erasure of a word comprises applying voltage Vpp to the corresponding wordline, through one row decoder RDEC1 or RDEC2, and applying voltage Vpp to the corresponding control gate line CGL through the corresponding column latch CLT while the corresponding source line is connected to ground. Programming of memory cells comprises applying voltage Vpp to the corresponding bitlines through the corresponding program latches, applying voltage Vpp to the corresponding wordline, and connecting to ground the corresponding control gate line CGL through the corresponding column latch.

A step of reading of memory cells is performed by control circuit CCT by means of sense amplifiers SA2, and comprises activating the current sources of the memory array opposite the memory array in which the memory cells to be read are located, then precharging the bitlines and reading data signal D1 or D2 on the corresponding data bus DTB1 or DTB2. For example, if memory cells in the memory array MA1 are to be read, control circuit CCT first selects the corresponding wordline by means of the row decoder RDEC1, and connects the N bitlines of the concerned column to sense amplifiers $SA2_0$ to $SA2_{N-1}$ by means of the column decoder CDEC1 and through column selection transistors CST of group CST1. Circuit CCT then activates the current sources CS2 in memory array MA2, applies the precharge, cascode and enable signals PRE, CSC, ENA in the above-described manner to sense amplifiers SA2, reads data D1 on data bus DTB1 (each sense amplifier provides a bit of a word $D1_0$ to $D1_{N-1}$), then provides them to the outside through interface ICT.

It will be noted that this example embodiment of a memory device using sense amplifiers according to one embodiment has been disclosed as a non-limiting example. Embodiments of sense amplifiers may be implemented in various types of memory architecture, and are usable in any application where the state of a memory cell can be determined by sensing a voltage drop on the terminals of the memory cell. Sense amplifiers SA2 may also be used in memory devices not having a dual-memory array as that described above. In that case, the second sense input SI2 is connected to a reference line that is not linked to bitlines of the memory array.

Figure 6:
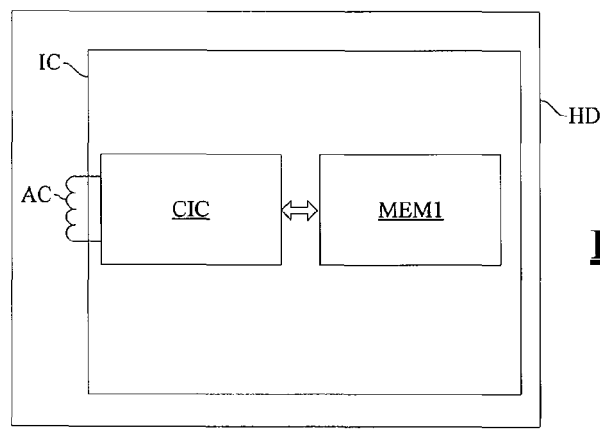
FIG. 6 shows a handheld device comprising a memory device comprising a sense amplifier according to one embodiment.

A memory device comprising sense amplifiers according to one embodiment is also susceptible of various embodiments and applications. As an example, FIG. 6 schematically shows a handheld device HD comprising an integrated circuit IC within which the above-described memory MEM1 or any other type of non-volatile memory including sense amplifiers according one embodiment is embedded. In one embodiment, the handheld device HD may be a contactless chip card, a tag, a mobile phone, a Personal Digital Assistant, etc, and may comprise a contactless communication interface circuit CIC to which the memory MEM1 is connected. The interface circuit CIC may be an NFC interface circuit (Near Field Communication) connected to an antenna coil AC, configured to exchange data by inductive coupling and load modulation, or may be a UHF interface circuit connected to a UHF antenna (not shown) and configured to exchange data by electric coupling and backscattering. The handheld device HD may be configured to communicate with an external device such as a contactless card or tag reader, a POS (Point of Sale), another NFC mobile phone, etc. The memory MEM1 may be used both to store code (in particular application programs) and application data.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sense amplifier comprising:
a first sense input;
a second sense input;
a latch including a first section configured to supply a first data signal at a first output node and a second section coupled to the first section and configured to supply a second data signal at a second output node;
a first p-channel control transistor arranged to electrically power the first section and having a gate terminal linked to the first sense input;
a second p-channel control transistor arranged to electrically power the second section and having a gate terminal linked to the second sense input; and
a clamp circuit configured to bring the first and second sense inputs to a voltage sufficiently low to bring the first and second control transistors into a conducting state in response to at least one of the first and second data signals crossing a threshold voltage.

2. The sense amplifier according to claim 1 wherein:
the first section of the latch comprises at least a first inverting gate;
the second section of the latch comprises at least a second inverting logic gate; and
the first and second inverting gates are cross-coupled.

3. The sense amplifier according to claim 1 wherein the clamp circuit includes first and second NMOS transistors configured to bring the first and second sense inputs to a voltage sufficiently low to bring the first and second control transistors into the conducting state in response to the at least one of the first and second data signals reaching a threshold voltage.

4. The sense amplifier according to claim 3 wherein the clamp circuit comprises an OR gate supplying a clamp signal when one of the first and second data signals of the latch reaches a threshold voltage of the OR gate.

5. The sense amplifier according to claim 1, comprising:
a first cascode transistor arranged between the first sense input and the gate terminal of the first control transistor; and
a second cascode transistor between the second sense input and the gate terminal of the second control transistor.

6. The sense amplifier according to claim 5, comprising:
a precharge circuit to bring the gate terminal of the first control transistor and the gate terminal of the second control transistor to a first voltage, and to bring, via the cascode transistors, the first sense input and the second sense input to a second voltage.

7. The sense amplifier according to claim 1 wherein a conducting terminal of the first control transistor and a control terminal of the second control transistor each receives an enable signal as a power voltage source.

8. A handheld device comprising:
memory cells;
bitlines electrically coupled to the memory cells;
a voltage supply node;
a sense amplifier including:
a first sense input electrically coupled to at least one of the bitlines;
a second sense input;
a latch having a first inverter configured to supply a first data signal and a second inverter electrically coupled to the first inverter and configured to supply a second data signal;
a first control transistor arranged to electrically power the first inverter and having a gate terminal electrically coupled to the first sense input, the first control transistor being electrically coupled between the first inverter and the voltage supply node; and
a second control transistor arranged to electrically power the second inverter and having a gate terminal electrically coupled to the second sense input, the second control transistor being electrically coupled between the second inverter and the voltage supply node.

9. The handheld device according to claim 8 having first and second memory arrays that include the memory cells and bitlines and wherein the first sense input is electrically coupled to bitlines of the first memory array and the second sense input is electrically coupled to bitlines of the second memory array.

10. The handheld device of claim 9 comprising an integrated circuit on a semiconductor chip, the first and second memory arrays being implemented in the integrated circuit.

11. The handheld device of claim 10 comprising a communication circuit.

12. The handheld device of claim 11 wherein the communication circuit comprises an antenna.

13. A method for sensing a memory cell, comprising:
supplying a first data signal from a first inverter of a latch;
supplying a second data signal from a second inverter of the latch coupled to the first inverter;
electrically powering the first inverter through a first control transistor by electrically coupling the first control transistor to a bitline electrically coupled to the memory cell, the first control transistor being electrically coupled between the first inverter and a power supply;
electrically powering the second inverter through a second control transistor by electrically coupling the second control transistor to a reference line, the second control transistor being electrically coupled between the second inverter and a power supply; and
bringing the bitline and the reference line to a voltage sufficiently low to bring the first and second control transistors into the conducting state, when at least one of the first and second data signals increases and reaches a threshold voltage.

14. A method for sensing a memory cell, comprising:
supplying a first data signal from a first inverter of a latch;
supplying a second data signal from a second inverter of the latch coupled to the first inverter;
electrically powering the first inverter through a first control transistor by electrically coupling the first control transistor to a bitline electrically coupled to the memory cell, the first control transistor being electrically coupled between the first inverter and a power supply;
electrically powering the second inverter through a second control transistor by electrically coupling the second control transistor to a reference line, the second control transistor being electrically coupled between the second inverter and a power supply; and
amplifying a voltage difference between the first sense input and the second sense input to obtain an amplified voltage difference and applying the amplified voltage difference between respective gate terminals of the control transistors.

15. A method for sensing a memory cell, comprising:
supplying a first data signal from a first inverter of a latch;
supplying a second data signal from a second inverter of the latch coupled to the first inverter;
electrically powering the first inverter through a first control transistor by electrically coupling the first control transistor to a bitline electrically coupled to the memory cell, the first control transistor being electrically coupled between the first inverter and a power supply;
electrically powering the second inverter through a second control transistor by electrically coupling the second control transistor to a reference line, the second control transistor being electrically coupled between the second inverter and a power supply; and
bringing a gate terminal of the first control transistor and a gate terminal of the second control transistor to a first voltage, and bringing the first sense input and the second sense input to a second voltage.

16. A memory comprising:
memory cells;
bitlines connecting the memory cells; and
a sense amplifier connected to at least one of the bit lines, the sense amplifier including:
 a first inverter configured to supply a first output signal;
 a second inverter cross coupled with the first inverter and configured to supply a second output signal;
 a sense input connected to one of the bit lines and to the first inverter;
 a reference input connected to a reference line and to the second inverter; and
 a clamp circuit configured to connect both the first and second inverters to a high supply voltage in response to either the first or the second output signal crossing a threshold voltage.

17. The memory of claim 16 comprising:
a first control PMOS transistor coupled between the first inverter and the high supply voltage; and
a second control PMOS transistor coupled between the second inverter and the high supply voltage, the clamp circuit configured to bring the first and the second control PMOS transistors to a conducting state when either the first or the second output crosses the threshold voltage.

18. The memory of claim 17 wherein the clamp circuit is configured to connect the respective control gates of the first and second control PMOS transistors to a low voltage supply when either the first or the second output crosses the threshold voltage.

19. The memory of claim 17 wherein the clamp circuit comprises an OR gate configured to receive as inputs the first and second output signals, an output of the OR gate configured to activate the clamp circuit to supply the low supply voltage to the respective control gates of the first and second control PMOS transistors.

20. The handheld device of claim 8 further comprising a clamp circuit configured to bring the first and second sense inputs to a voltage sufficiently low to bring the first and second control transistors into a conducting state in response to at least one of the first and second data signals crossing a threshold voltage.

21. A handheld device comprising:
memory cells;
bitlines electrically coupled to the memory cells;
a voltage supply node;
a sense amplifier including:
 a first sense input electrically coupled to at least one of the bitlines;
 a second sense input;
 a latch having a first inverter configured to supply a first data signal and a second inverter electrically coupled to the first inverter and configured to supply a second data signal; and
 a first control transistor arranged to electrically power the first inverter and having a gate terminal electrically coupled to the first sense input, the first control transistor being electrically coupled between the first inverter and the voltage supply node; and
 a second control transistor arranged to electrically power the second inverter and having a gate terminal electrically coupled to the second sense input, the second control transistor being electrically coupled between the second inverter and the voltage supply node;
first and second memory arrays that include the memory cells and bitlines and wherein the first sense input is electrically coupled to at least one bitline of the first memory array and the second sense input is electrically coupled to at least one bitline of the second memory array.

22. The handheld device of claim 21 further comprising a clamp circuit configured to bring the first and second sense inputs to a voltage sufficiently low to bring the first and second control transistors into a conducting state in response to at least one of the first and second data signals crossing a threshold voltage.

23. The method of claim 13 comprising amplifying a voltage difference between the first sense input and the second sense input to obtain an amplified voltage difference and applying the amplified voltage difference between respective gate terminals of the control transistors.

24. The method of claim 14 comprising bringing the bitline and the reference line to a voltage sufficiently low to bring the first and second control transistors into the conducting state, when at least one of the first and second data signals increases and reaches a threshold voltage.

25. The method of claim 15 comprising amplifying a voltage difference between the first sense input and the second sense input to obtain an amplified voltage difference and applying the amplified voltage difference between respective gate terminals of the control transistors.

* * * * *

UNITED STATES PATENT AND TRADEMARK OFFICE
CERTIFICATE OF CORRECTION

PATENT NO. : 8,363,499 B2
APPLICATION NO. : 12/844472
DATED : January 29, 2013
INVENTOR(S) : Francesco La Rosa Page 1 of 1

It is certified that error appears in the above-identified patent and that said Letters Patent is hereby corrected as shown below:

On the Title Page

Item (73):
"STMicroelectrics (Rousset) SAS (FR)" should read, --STMicroelectronics (Rousset) SAS (FR)--.

Signed and Sealed this
Twentieth Day of August, 2013

Teresa Stanek Rea
*Acting Director of the United States Patent and Trademark Office*